United States Patent [19]
Glenning et al.

[11] Patent Number: 5,126,016
[45] Date of Patent: Jun. 30, 1992

[54] CIRCUITIZATION OF POLYMERIC CIRCUIT BOARDS WITH GALVANIC REMOVAL OF CHROMIUM ADHESION LAYERS

[75] Inventors: John J. Glenning, Montrose, Pa.; Walter P. Pawlowski, Endicott, N.Y.; Kenneth G. Sakorafos, Brookfield, Conn.

[73] Assignee: International Business Machines Corporation, Armonk, N.Y.

[21] Appl. No.: 649,513

[22] Filed: Feb. 1, 1991

[51] Int. Cl.[5] .......................... C25D 5/02; C25F 3/02
[52] U.S. Cl. .............................. 205/125; 204/129.65; 204/129.75
[58] Field of Search ................. 204/15, 129.65, 129.75

[56] References Cited
U.S. PATENT DOCUMENTS
2,840,521  6/1958  Wasserman .................... 204/129.75

OTHER PUBLICATIONS

"Polymers & Polymer-Based Composites for Electronic Applications" G. P. Schmitt et al., pp. 334–371.

"Printed Circuit-Board Packaging", D. P. Seraphim et al.; pp. 853–921.

*Primary Examiner*—T. M. Tufariello
*Attorney, Agent, or Firm*—Richard M. Goldman

[57] ABSTRACT

Disclosed is a method of fabricating a microelectronic package, especially a microelectronic package having copper circuitization on a dielectric substrate. The method includes the steps of depositing a chromium adhesion layer on the dielectric substrate, depositing a copper seed layer on the chromium adhesion layer, depositing photoresist on the copper seed layer, imaging and developing the photoresist, and forming a pattern of copper circuitization on the selected portions of the send copper layer. The chromium adhesion layer material is removed from the dielectric substrate by contacting the chromium adhesion layer with aqueous sulfuric acid electrolyte, while maintaining the chromium adhesion layer electrolytically in series with a counterelectrode, and maintaining the chromium adhesion layer anodic with respect to the counterelectrode. The chromium adhesion layer material is oxidized to soluble $Cr^{+3}$, while substantially avoiding formation of $Cr^{+6}$.

10 Claims, 4 Drawing Sheets

CIRCUITIZATION OF POLYMERIC CIRCUIT BOARDS WITH GALVANIC REMOVAL OF CHROMIUM ADHESION LAYERS

FIELD OF THE INVENTION

The invention relates to the fabrication of microelectronic circuit packages. More particularly the invention relates to microelectronic circuit packages having polymeric layers with circuitization applied thereto. Generally, the metallization is multi-layer, with a chromium adhesion layer sputtered onto the polymer, and a copper "seed" layer deposited onto the chromium adhesion layer.

As part of the circuitization process the copper "seed" layer and the chromium "adhesion" layer are ultimately removed from uncircuitized areas. For example, in additive circuitization, photoresist is applied atop the "seed" copper, imaged, and developed in areas where circuitization is to be applied, leaving resist over areas to remain uncircuitized. After application of the circuitization in a desired pattern, the non-circuitized regions still have photoresist, "seed" copper, and a chromium adhesion layer underneath the "seed" copper. The photoresist, the copper "seed" layer, and the chromium adhesion layer are then removed in sequential steps.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

Packages may be characterized by the material used as the dielectric, i.e., as ceramic packages or as polymeric packages. The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummala and Rymaszewski, *Microelectronics Packaging Handbook*, pages 853–922, also previously incorporated herein by reference.

In the normal process for package fabrication a fibrous body, such as a non-woven mat or woven web, is impregnated with a resin. This step includes coating the fibrous body with, for example, an epoxy resin solution, evaporating the solvents associated with the resin, and partially curing the resin. The partially cured resin is called a B-stage resin. The body of fibrous material and B stage resin is called a prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers. One epoxy prepreg is the FR-4 prepreg. FR-4 is a fire retardant epoxy-glass cloth material, where the epoxy resin is the diglycidyl ether of 2,2'-bis(4-hydroxyphenyl) propane. This epoxy resin is also known as the diglycidyl ether of bisphenol-A, (DGEBA). The fire retardancy of the FR-4 prepreg is obtained by including approximately 15–20 weight percent bromine in the resin. This is done by partially substituting brominated DGEBA for the DGEBA.

Other epoxy resin formulations useful in providing prepregs include high functionality resins, such as epoxidized cresol novolacs, and epoxidized derivatives of triphenyl methane. The multifunctional epoxy resins are characterized by high glass transition temperatures, high thermal stability, and reduced moisture take up.

Still other epoxy resins are phenolic cured epoxies, as Ciba-Giegy RD86-170 ™, Ciba-Giegy RD87-211 ™, Ciba-Giegy RD87-212 ™, Dow Quatrex ® 5010 ™, Shell Epon ®, and the like. These epoxies are mixtures of epoxies, with each epoxy having a functionality of at least 2, a phenolic curing agent with a functionality of at least 2, and an imidazole catalyst.

Cyanate ester resins are also used in forming prepregs. One type of cyanate ester resin includes dicyanates mixed with methylene dianiline bis-maleimide. This product may be further blended with compatible epoxides to yield a laminate material. One such laminate material is a 50:45:5 (parts by weight) of epoxy: cyanate: maleimide. Typical of cyanate ester resins useful in forming prepregs is the product of bisphenol-A dicyanate and epoxy, which polymerizes during lamination to form a crosslinked structure.

A still further class of materials useful in forming prepregs for rigid multilayer boards are thermosetting polyimides. While thermosetting polyimides exhibit high water absorption, and high cost, they have good thermal properties and desirable mechanical properties. The preferred polyimides for prepreg use are addition products such as polyimides based on low molecular weight bis-maleimides.

Subsequent processing of polymeric substrates includes circuitization, that is, the formation of a Cu signal pattern or power pattern on the prepreg, or lamination of the prepreg to a power core. Circuitization may be additive or subtractive.

In the case of additive circuitization a thin film of an adhesion layer, such as a thin film of chromium, is first applied to the prepreg or polymeric dielectric. The adhesion layer may be applied by sputtering. Typically, the film of adhesion metal is from about 500 Angstroms to about 2000 Angstroms. Thicker layers of chromium result in internal stresses, while thinner layers may be non-continuous.

Thereafter a "seed" layer of copper is applied atop the adhesion layer. This copper layer is from about 3000 Angstroms thick to about 25,000 Angstroms (2.5 microns) thick. It may be applied by sputtering, evaporation, electrodeposition, or electroless deposition.

Subsequently, photoresist is applied atop the copper "seed" layer, imaged, and developed to provide a pattern for circuit deposition. Copper circuitization is then plated onto the exposed copper "seed" layer to provide the circuitization pattern on the surface of the package. The remaining photoresist is then stripped, leaving a thick copper plated circuitization pattern and a thin multilayer "background" of a "seed" copper layer and a chromium adhesion layer.

The "seed" copper can be etched by various methods well known in the art. The chromium adhesion layer is removed, for example, by etching to $Cr^{+6}$, which while difficult to subsequently process, is soluble. Alternatively, permanganate etches and/or chloride etches can be used. However, these etchants require careful cleaning steps to removed permanganate or chloride entrapped within crevices. Permanganate and hydrochloric acid so entrapped and/or entrained can result in loss of adhesion long after fabrication. The resulting circuitized prepreg is called a core.

The composite printed circuit package is fabricated by interleaving cores (including signal cores, signal/signal cores, power cores, power/power cores, and signal/power cores) with additional sheets of prepreg, and surface circuitization. Holes, as vias and through holes, may be drilled in individual core structures, for example, before or after circuitization, as described above, or in partially laminated modules.

OBJECTS OF THE INVENTION

It is one object of the invention to provide high density cards and boards, ceramic circuits, and thin films.

It is another object of the invention to remove the chromium adhesion layer without the formation of $Cr^{+6}$.

It is a further object of the invention to remove the chromium adhesion layer without damage to the copper circuitization.

It is a further object of the invention to remove the chromium adhesion layer without damage to copper circuitization.

It is a further object of the invention to remove the chromium adhesion layer without substantial undercutting of the copper circuitization.

It is a further object of the invention to remove the chromium adhesion layer by a process that allows real time observation and control.

SUMMARY OF THE INVENTION

These and other objects are obtained by the microelectronic circuit package fabrication method of the invention. The fabrication method is useful for fabricating a microelectronic package having copper surface circuitization.

The fabrication method includes removal of the "seed" layer, followed by galvanic removal of the chromium adhesion layer in a dilute aqueous $H_2SO_4$ (sulfuric acid) solution, where the chromium is rendered anodic with respect to a large surface area cathode.

According to the method disclosed herein a microelectronic circuit package is fabricated having a copper circuitization on a dielectric substrate. According to the method of the invention, a chromium adhesion layer is deposited on the dielectric substrate, and a copper seed layer is deposited on the chromium adhesion layer. The surface circuitization is formed by depositing photoresist on the copper seed layer, imaging and developing the photoresist, and forming a pattern of copper circuitization on the selected portions of the seed copper layer.

Either before formation of the surface circuitization in the case of subtractive circuitization, or after formation of the surface circuitization in the case of additive circuitization, the copper "seed" layer and the chromium adhesion layer are removed. The copper "seed" layer is removed conventionally. The chromium adhesion layer material is then removed from the dielectric substrate by contacting the chromium adhesion layer with aqueous sulfuric acid electrolyte while maintaining the chromium adhesion layer electrolytically in series with a counterelectrode. The chromium adhesion layer is maintained anodic with respect to the counterelectrode.

According to the invention the chromium adhesion layer material is oxidized under conditions to form soluble $Cr^{+3}$, while substantially avoiding formation of $Cr^{+6}$.

The chromium adhesion layer may be electrodeposited, evaporated, or sputter deposited onto the dielectric.

The aqueous sulfuric acid is dilute aqueous sulfuric acid. Dilute sulfuric acid contains from about 10 volume percent $H_2SO_4$ to about 25 volume percent $H_2SO_4$. Furthermore, in order to avoid formation of soluble $CuCl_2$, the electrolyte is substantially free of $Cl^-$ ion.

The counterelectrode is formed of a metal more electronegative then chromium. These metals include, solely by way of exemplification, and not limitation Ti and Ni.

THE FIGURES

The invention must be understood by reference to the Figures.

DETAILED DESCRIPTION OF THE INVENTION

Figure 1:
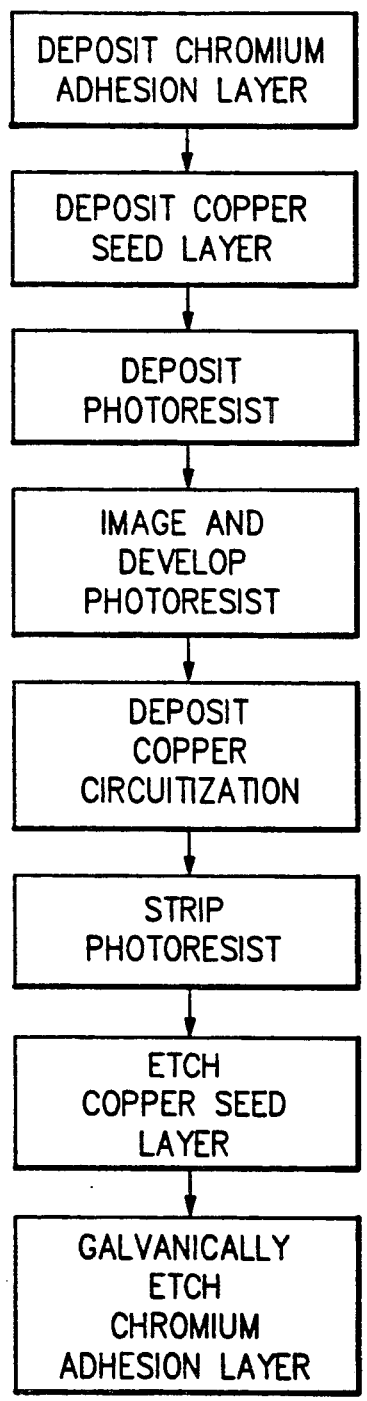
FIG. 1 is a flow chart of the method of the invention.
Figure 2A:
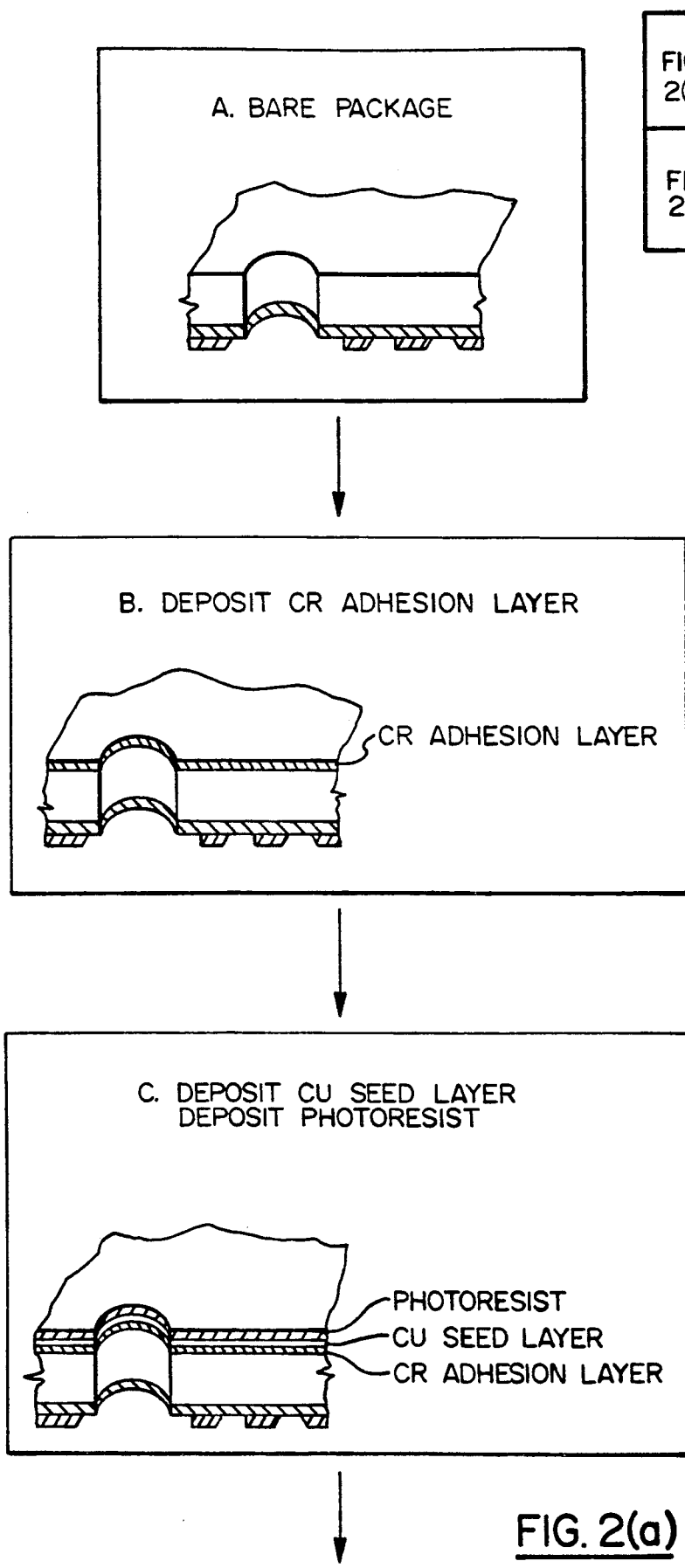
FIG. 2a–2b is a series of perspective, partial cut-away views of a microelectronic circuit package in various stages of the method of the invention.
Figure 2B:
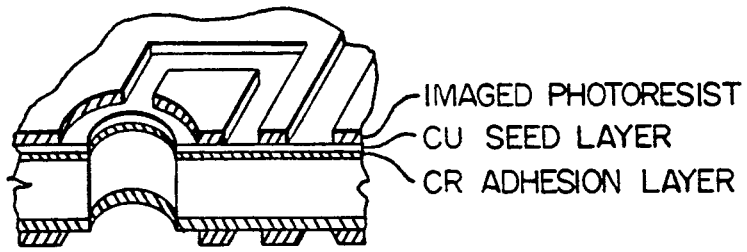
Figure 2B:
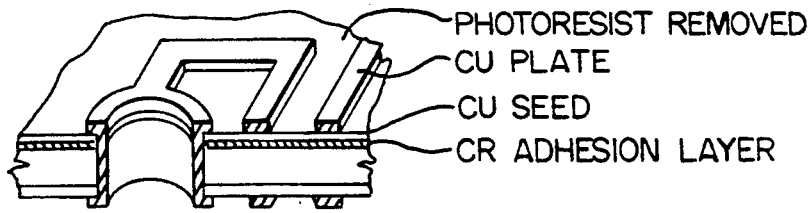
Figure 2B:
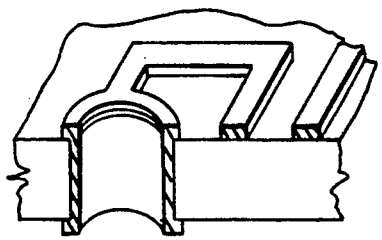

The method of the invention is illustrated in the flow charts of FIGS. 1 and 2. FIGS. 1 and 2 illustrate a flow chart of a microelectronic circuit package fabrication method useful for fabricating a microelectronic package According to the method disclosed herein a microelectronic circuit package is fabricated having copper circuitization on a dielectric substrate. According to the method of the invention, a chromium adhesion layer is deposited on the dielectric substrate, and a copper seed layer is deposited on the chromium adhesion layer. The chromium adhesion layer may be electrodeposited, evaporated, or sputter deposited onto the dielectric. The surface circuitization is formed by depositing photoresist on the "seed" copper layer, imaging and developing the photoresist, and forming a pattern of copper circuitization on the selected portions of the seed copper layer.

The fabrication method includes removal of the "seed" copper layer, followed by galvanic removal of the chromium adhesion layer in a dilute aqueous $H_2SO_4$ (sulfuric acid) solution, where the chromium is rendered anodic with respect to a large surface area cathode.

Either before formation of the surface circuitization in the case of subtractive circuitization, or after formation of the surface circuitization in the case of additive circuitization, the copper "seed" layer and the chromium adhesion layer are removed. The copper "seed" layer is removed conventionally. The chromium adhesion layer material is then removed from the dielectric substrate by contacting the chromium adhesion layer with aqueous sulfuric acid electrolyte while maintaining the chromium adhesion layer electrolytically in series with a counterelectrode. The chromium adhesion layer is maintained anodic with respect to the counterelectrode.

The aqueous sulfuric acid is dilute aqueous sulfuric acid Dilute sulfuric acid contains from about 10 volume percent $H_2SO_4$ to about 25 volume percent $H_2SO_4$. Nitric acid and phosphoric acid are undesirable in that nitric acid is inoperative to effect removal of the chromium, while phosphoric acid will attack the remaining copper. Furthermore, in order to avoid formation of soluble $CuCl_2$, the electrolyte is substantially free of $Cl^-$ ion.

The counterelectrode is formed of a metal more electronegative then chromium. These metals include, solely by way of exemplification, and not limitation Ni, Sn, Pb, Ti, Cu, and Ag. The reaction at the chromium adhesion layer is:

$$Cr^0 \rightarrow Cr^{+3} + 3e^-,$$

while the counterelectrode reaction is:

$$2H^+ + 2e^- \rightarrow H_2,$$

with balancing, with an overall reaction $$2Cr + 6H^+ \rightarrow 2Cr^+ + 3H_2(g).$$

Generally, the counterelectrode surface area is greater then the surface area of the microelectronic circuit package.

More particularly, the chromium adhesion layer and the counterelectrode are connected through an external circuit, which acts as a direct short circuit. This allows the chromium to be put electrical contact, through a galvanic couple, with a counter electrode that is formed of a metal that is more electronegative, i.e., has a lower oxidation potential, than the chromium.

According to the invention, the chromium adhesion layer material is galvanically oxidized under conditions to form soluble $Cr^{+3}$, while substantially avoiding formation of $Cr^{+6}$. It is noted that $Cr^{+6}$ is environmentally difficult to handle. Moreover, the use of dilute $H_2SO_4$ in a galvanic couple to remove the chromium adhesion layer is preferable to, for example, potassium permanagnate, because of the compatbility of dilute $H_2SO_4$ with aqueous photoresist systems, and of the difficulty of potassium permanganate disposal.

According to the method disclosed herein, a high degree of etch rate control is achieved. This is because the process is an electrolytic process where the package is immersed in an acidic electrolyte including a shorted counter-electrode. The electrolyte wets the exposed surface of chromium adhesion layer. The chromium layer and the counter-electrode are directly shorted through the external circuit. The rate in such a system is determined by the ratio of cathode area (counter-electrode) to anode area (chromium adhesion layer), and the hydrogen ion concentration, $H^+$, in the electrolyte.

The etching reaction is stopped by breaking the external circuit. By way of contrast, permanganate etch and hydrochloric acid etch do not depend on electron transport through an external circuit, and continue, even after the package is removed from the etchant vessel. Permanganate and hydrochloric acid so entrapped and/or entrained can result in undercutting and loss of adhesion long after fabrication. Moreover, permanganate requires acid rinsing, water rinsing, and neutralization, while sulfuric acid just requires a water rinse.

According to a particularly preferred exemplification of the invention increased electrolyte contact and diffusivity may be provided by ultrasonically agitating the electrolyte.

Figure 3:
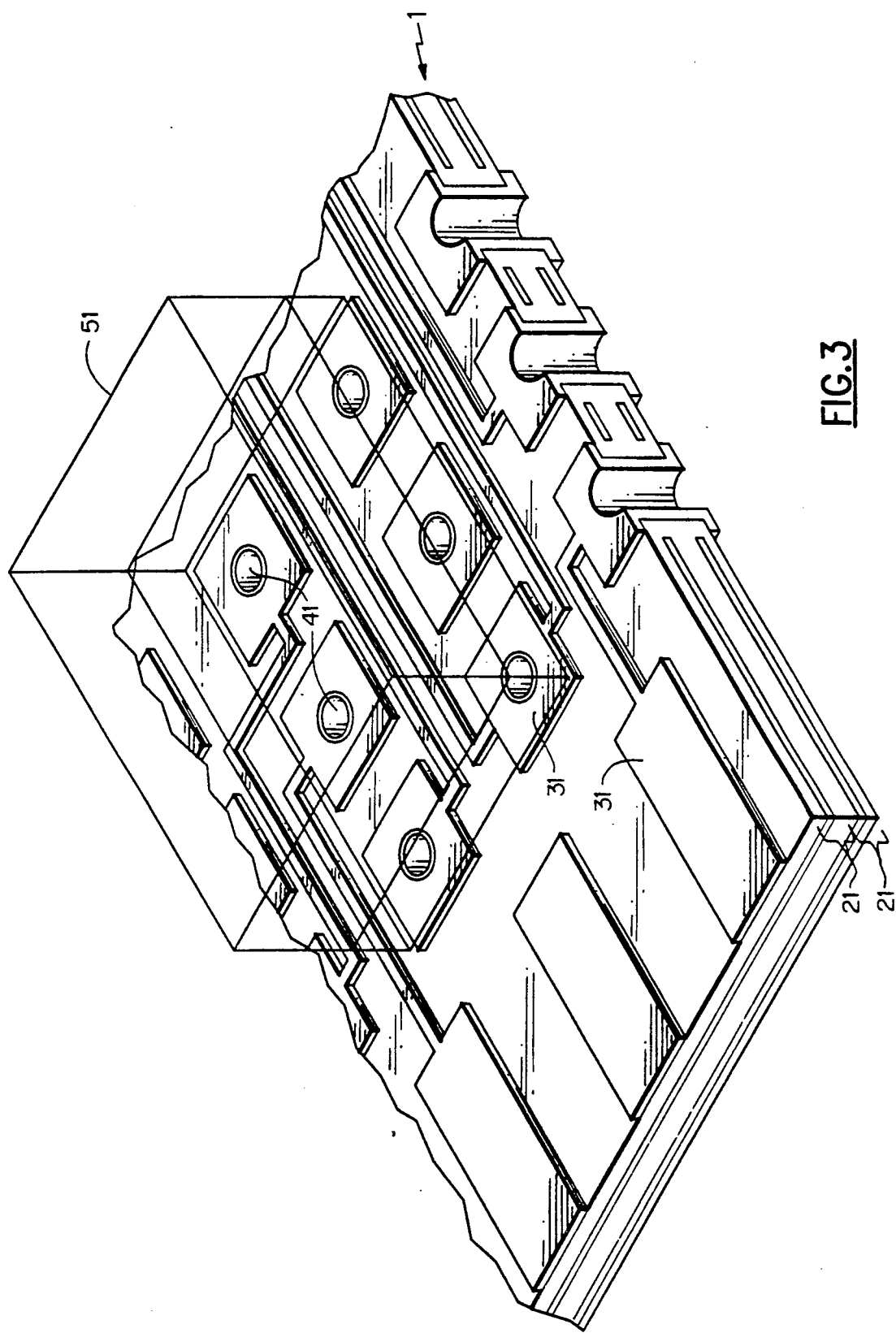
FIG. 3 is a partial cut-away view of a microelectronic circuit package produced according to the method of the invention.

A microelectronic circuit package prepared by a method of the invention is shown in FIG. 3. The circuit package 1 a pair of polymeric layers 21. The polymeric layers carry surface circuitization 31 including through holes 41 and at least one integrated circuit chip 51.

While the invention has been described with respect to certain preferred embodiments and exemplifications, it is not intended to limit the scope of the invention thereby, but solely by the claims appended hereto.

We claim:

1. In a method of fabricating a microelectronic package having copper circuitization on a dielectric substrate, comprising depositing a chromium adhesion layer on the dielectric substrate, depositing a copper seed layer on the chromium adhesion layer, depositing photoresist on the copper seed layer, imaging and developing the photoresist, and forming a pattern of copper circuitization on the selected portions of the seed copper layer, the improvement comprising removing chromium adhesion layer material from the dielectric substrate by contacting the chromium adhesion layer with aqueous sulfuric acid electrolyte while maintaining the chromium adhesion layer electrolytically in series with a counterelectrode, and maintaining the chromium adhesion layer anodic with respect to the counterelectrode.

2. The method of claim 1 comprising oxidizing chromium adhesion layer material to soluble $Cr^{+3}$.

3. The method of claim 2 comprising oxidizing chromium adhesion layer material to soluble $Cr^{+3}$ while substantially avoiding formation of $Cr^{+6}$.

4. The method of claim 1 comprising electrodepositing the chromium adhesion layer onto the dielectric.

5. The method of claim 1 comprising sputter depositing the chromium adhesion layer onto the dielectric.

6. The method of claim 1 wherein the aqueous sulfuric acid is dilute aqueous sulfuric acid.

7. The method of claim 6 wherein the dilute aqueous sulfuric acid contains from about 10 volume percent $H_2SO_4$ to about 25 volume percent $H_2SO_4$.

8. The method of claim 6 wherein the electrolyte is substantially free of $Cl^-$ ion.

9. The method of claim 1 wherein the counterelectrode comprises a metal more electronegative than chromium.

10. The method of claim 8 wherein the counterelectrode comprises a metal chosen from the group consisting of Ti and Ni.

* * * * *